United States Patent
Song

(10) Patent No.: US 11,343,935 B2
(45) Date of Patent: May 24, 2022

(54) FOOLPROOF FRAME ASSEMBLY AND SERVER CHASSIS INCLUDING THE SAME

(71) Applicants: INVENTEC (PUDONG) TECHNOLOGY CORPORATION, Shanghai (CN); INVENTEC CORPORATION, Taipei (TW)

(72) Inventor: Er-Zhen Song, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/151,160

(22) Filed: Jan. 16, 2021

(65) Prior Publication Data

US 2021/0378125 A1    Dec. 2, 2021

(30) Foreign Application Priority Data

May 29, 2020  (CN) .......................... 202010478030.9

(51) Int. Cl.
*G06F 1/18*  (2006.01)
*H05K 7/14*  (2006.01)
*G06F 1/20*  (2006.01)

(52) U.S. Cl.
CPC ......... *H05K 7/1489* (2013.01); *H05K 7/1487* (2013.01)

(58) Field of Classification Search
CPC .. H05K 7/1489; H05K 7/1487; H05K 7/1474; H05K 7/20172; G06F 1/20; H02B 1/052

USPC .................................................... 361/679.02
See application file for complete search history.

(56) References Cited

U.S. PATENT DOCUMENTS

| 7,002,796 | B2 * | 2/2006 | Lao | H05K 7/20581 |
| | | | | 361/679.48 |
| 8,567,746 | B2 * | 10/2013 | Li | G06F 1/183 |
| | | | | 361/679.48 |
| 2012/0145877 | A1 * | 6/2012 | Chiu | G06F 1/20 |
| | | | | 248/674 |
| 2020/0146185 | A1 * | 5/2020 | Wu | H05K 7/20172 |
| 2020/0205314 | A1 * | 6/2020 | Chu | H05K 7/20172 |

\* cited by examiner

*Primary Examiner* — Adrian S Wilson
*Assistant Examiner* — Gage Crum
(74) *Attorney, Agent, or Firm* — Maschoff Brennan

(57) ABSTRACT

A foolproof frame assembly includes a blocking component fixed on a case, and first and second frames disposed on opposite sides of the case. Each of the first and second frames has a foolproof component fixed to one of two side plates thereof and blocking one of two through holes on its bottom plate. When the first frame is in a first mounting position, the blocking component passes through another through hole and form a space with another side plate of the first frame for one of two mounting side plates of the mounting frame to be disposed therethrough. When the second frame is in the first mounting position, a space occupied by its foolproof component overlaps a space occupied by the blocking component. When the first and second frames are respectively in the first and second mounting positions, the foolproof components block the two mounting side plates.

10 Claims, 8 Drawing Sheets

FOOLPROOF FRAME ASSEMBLY AND SERVER CHASSIS INCLUDING THE SAME

CROSS-REFERENCE TO RELATED APPLICATIONS

This non-provisional application claims priority under 35 U.S.C. § 119(a) on Patent Application No(s). CN,202010478030.9 filed in China on May 29, 2020, the entire contents of which are hereby incorporated by reference.

TECHNICAL FIELD

This disclosure relates to a foolproof frame assembly and a server chassis, more particularly to a foolproof frame assembly having low-cost structural design and a foolproof component for achieving double foolproof protection and a server chassis including the foolproof frame assembly.

BACKGROUND

Nowadays, the configuration of electronic devices has become much more complicated, which makes the assembling process thereof has become much more complex, too. If one component is installed either in a wrong direction or a wrong place in an electronic device, it may result in malfunction of the electronic device. For example, if a fan module is installed in a wrong direction in the electronic device, heat generated in the electronic device cannot be effectively dissipated, and it may cause damage to the electronic device when in operation. Therefore, in order to prevent such situation from occurring, a foolproof mechanism is required.

The foolproof mechanism usually includes directional complementary structures respectively on the electronic device and components thereof, such that the electronic device and the components can be properly assembled, thereby preventing the increase of costs due to improper installation. Regarding the multiple steps of assembling process of the electronic device, improper installations in every step should all be avoided so as to ensure that the electronic device functions normally. However, if several additional foolproof structures or even additional assemblies having foolproof structures are added in order to ensure correct installation in every step of the assembling process, the manufacturing cost of the electronic device may increase. Take a fan module as an example, conventionally, in order to prevent the fan module from being installed in a wrong direction, two fan frames on opposite sides of the case of the electronic device are respectively provided with at least two different foolproof structures, such that the fan frames are required to be manufactured by different molds, thus increasing manufacturing cost of the electronic device. Therefore, how to obtain a balance between the design of foolproof structures and manufacturing cost of the electronic device while ensuring proper installation in every step of the assembly process is an important topic.

SUMMARY

The present disclosure is to provide a foolproof frame assembly and a server chassis including the same, which are capable of obtaining a balance between the design of foolproof structures and manufacturing cost of the electronic device while ensuring proper installation in every step of the assembly process.

One embodiment of the disclosure provides a foolproof frame assembly configured to be disposed on a case of a server chassis and configured for a mounting frame to be disposed thereon. The mounting frame includes a main body and two mounting side plates respectively protruding from two opposite sides of the main body. The foolproof frame assembly includes a first blocking component, a first frame, and a second frame. The first blocking component is configured to be fixed on the case. The first frame is configured to be disposed in a first mounting position located at one side of the case. The first frame includes a first bottom plate, two first side plates and a first foolproof component. The first bottom plate has two first through holes. The two first side plates are respectively connected to two opposite sides of the first bottom plate and both non-parallel to the first bottom plate. The first foolproof component is fixed to one of the two first side plates and blocks one of the two first through holes of the first bottom plate. When the first frame is disposed in the first mounting position, the first blocking component is disposed through the other of the two first through holes of the first bottom plate, and the first blocking component and the other of the two first side plates together form a first space configured for one of the two mounting side plates of the mounting frame to be disposed therethrough. The second frame is configured to be disposed in a second mounting position located at another side of the case opposite to the first mounting position. The second frame includes a second bottom plate, two second side plates and a second foolproof component. The second bottom plate has two second through holes. The two second side plates are respectively connected to two opposite sides of the second bottom plate and both non-parallel to the second bottom plate. The second foolproof component is fixed to one of the two second side plates and blocks one of the two second through holes of the second bottom plate. When the second frame is disposed in the first mounting position, a space occupied by the second foolproof component overlaps a space occupied by the first blocking component. When the first frame is disposed in the first mounting position and the second frame is disposed in the second mounting position, the first foolproof component and the second foolproof component are configured to block the two mounting side plates of the mounting frame so as to make one of the two mounting side plates disposed through the first space, and thus the mounting frame is maintained in a predetermined mounting position.

One embodiment of the disclosure provides a server chassis. The server chassis includes a case, a mounting frame, and a foolproof frame assembly. The mounting frame includes a main body and two mounting side plates respectively protruding from two opposite sides of the main body. The foolproof frame assembly includes a first blocking component, a first frame, and a second frame. The first blocking component is fixed on the case. The first frame is disposed in a first mounting position located at one side of the case. The first frame includes a first bottom plate, two first side plates and a first foolproof component. The first bottom plate has two first through holes. The two first side plates are respectively connected to two opposite sides of the first bottom plate and both non-parallel to the first bottom plate. The first foolproof component is fixed to one of the two first side plates and blocks one of the two first through holes of the first bottom plate. When the first frame is disposed in the first mounting position, the first blocking component is disposed through the other of the two first through holes of the first bottom plate, and the first blocking component and the other of the two first side plates together form a first space configured for one of the two mounting side plates of the mounting frame to be disposed therethrough. The second frame is disposed in a second mounting position located at another side of the case opposite to the first mounting position. The second frame includes a second bottom plate, two second side plates and a second foolproof component. The second bottom plate has two second through holes. The two second side plates are respectively connected to two opposite sides of the second bottom plate and both non-parallel to the second bottom plate. The second foolproof component is fixed to one of the two second side plates and blocks one of the two second through holes of the second bottom plate. When the second frame is disposed in the first mounting position, a space occupied by the second foolproof component overlaps a space occupied by the first blocking component. When the first frame is disposed in the first mounting position and the second frame is disposed in the second mounting position, the first foolproof component and the second foolproof component are configured to block the two mounting side plates of the mounting frame so as to make one of the two mounting side plates disposed through the first space, and thus the mounting frame is maintained in a predetermined mounting position.

According to the server chassis and the foolproof frame assembly thereof as described above, by disposing the first blocking component in the predetermined mounting position on the case corresponding to the first frame, and by the collaboration of the second foolproof component of the second frame, an unexpected installation of the second frame being disposed in the first mounting position is prevented, and thus an unexpected installation of the first frame being disposed in the second mounting position is also prevented. Furthermore, the first foolproof component and the second foolproof component are configured to block the mounting side plates of the mounting frame so as to make one of the mounting side plates disposed through the first space formed between the first blocking component and the first side plate, and thus the mounting frame is maintained in the predetermined mounting position, thereby realizing foolproof protection, preventing the heat dissipation fans in the mounting frame from being installed in a wrong direction, and ensuring that heat generated in the server device is effectively dissipated.

Furthermore, since the first bottom plate, the first side plates and the first support plates of the first frame have the same structure as that of the second bottom plate, the second side plates and the second support plates of the second frame, they can be manufactured by the same mold. Then, the first frame and the second frame, which are mirror-symmetrical to each other, can be formed by riveting the first foolproof component to the first side plate of the first sheet metal component and riveting the second foolproof component to the second side plate of the second sheet metal component. Therefore, the manufacturing cost of the server chassis can be reduced because there is no need to use different molds for manufacturing the first frame and the second frame.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The drawings may not be drawn to actual size or scale, some exaggerations may be necessary in order to emphasize basic structural relationships, while some are simplified for clarity of understanding, and the present disclosure is not limited thereto. It is allowed to have various adjustments under the spirit of the present disclosure. In the embodiments and drawings of the specification, terms for describing positions and directions, such as "top", "bottom", "left" and "right", are used to illustrate but limit the present disclosure. The term "substantially" is referred to the complete or nearly complete extent or degree of a structure, which means that it is allowable to have tolerance during manufacturing.

Figure 1:
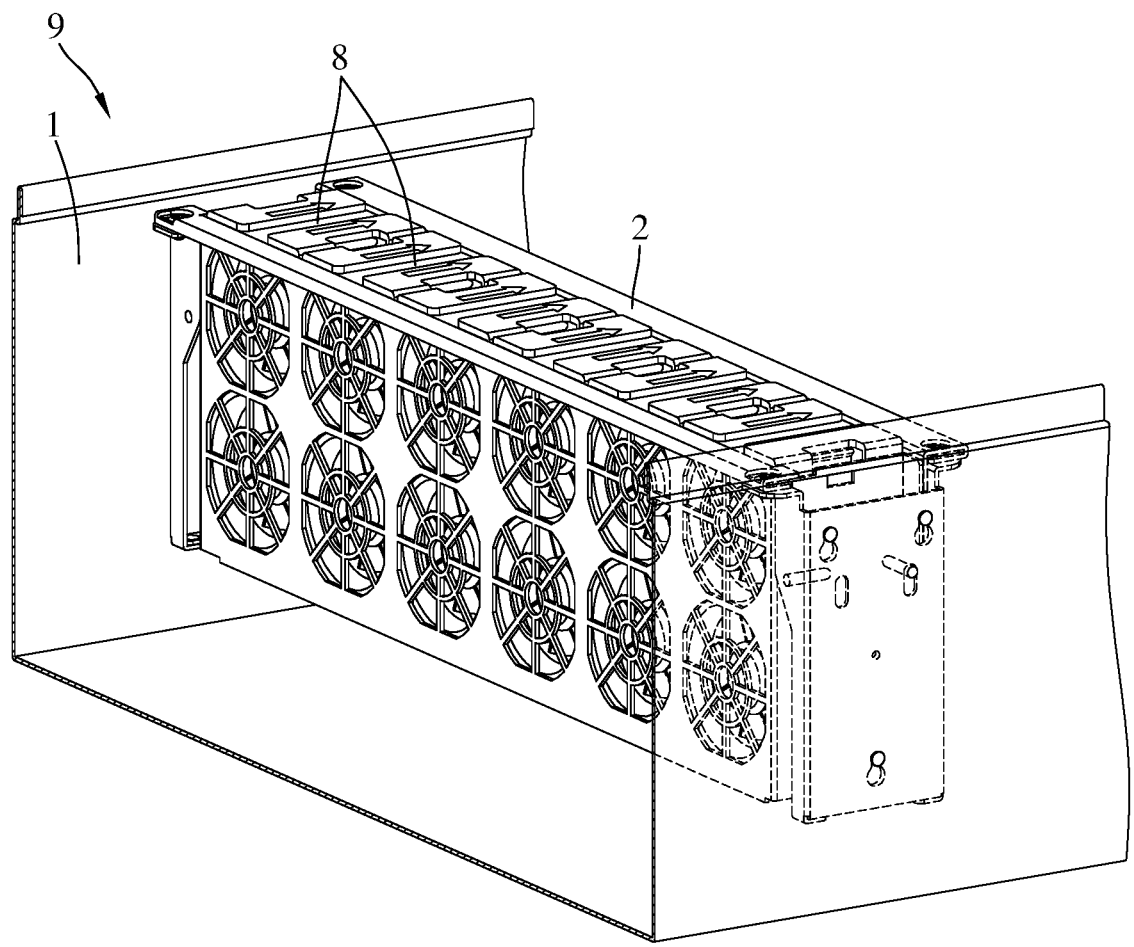
FIG. 1 is a perspective view of a server chassis and heat dissipation fans in accordance with one embodiment of the disclosure.
Figure 2:
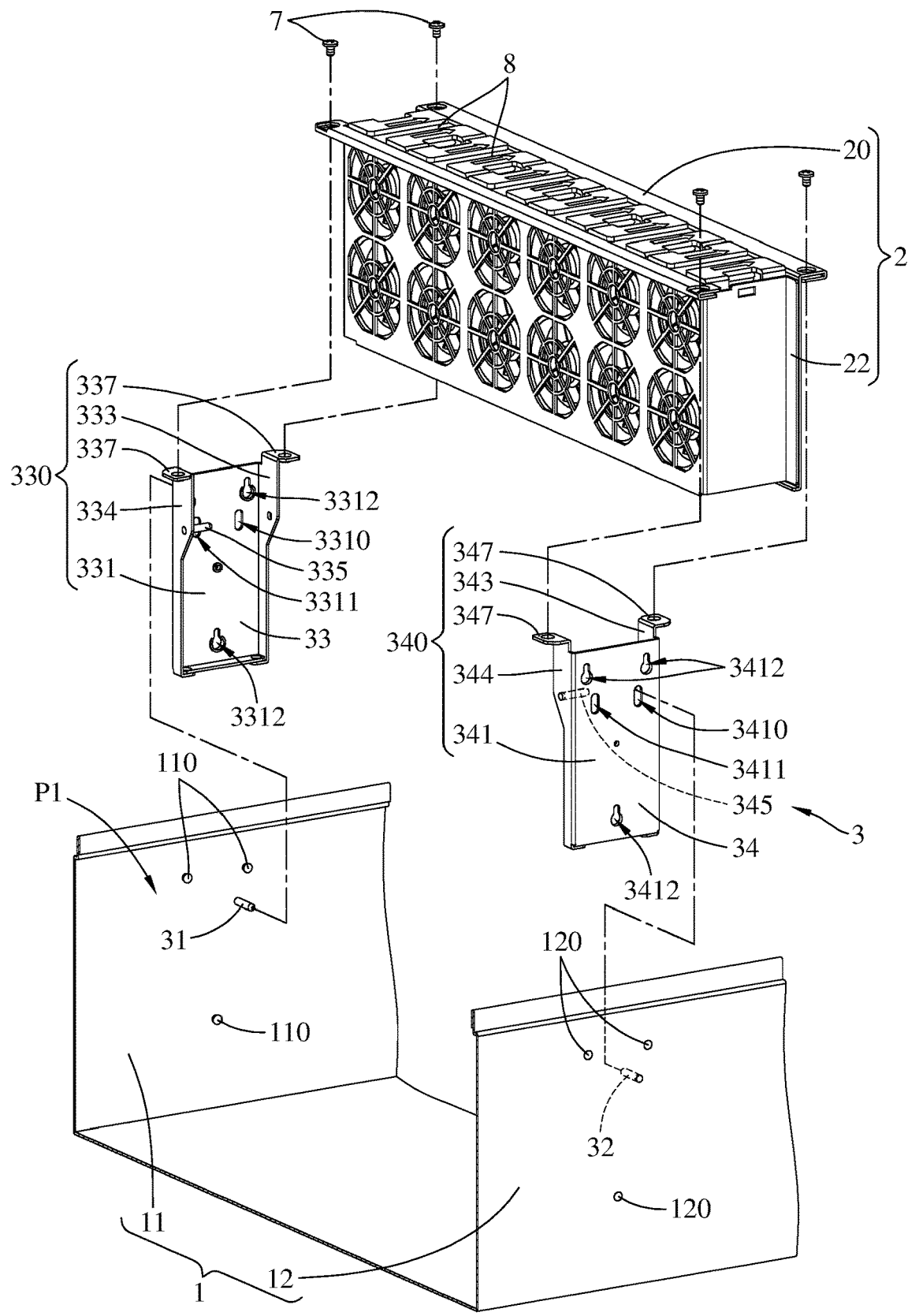
FIG. 2 is an exploded view of the server chassis and the heat dissipation fans in FIG. 1.
Figure 3:
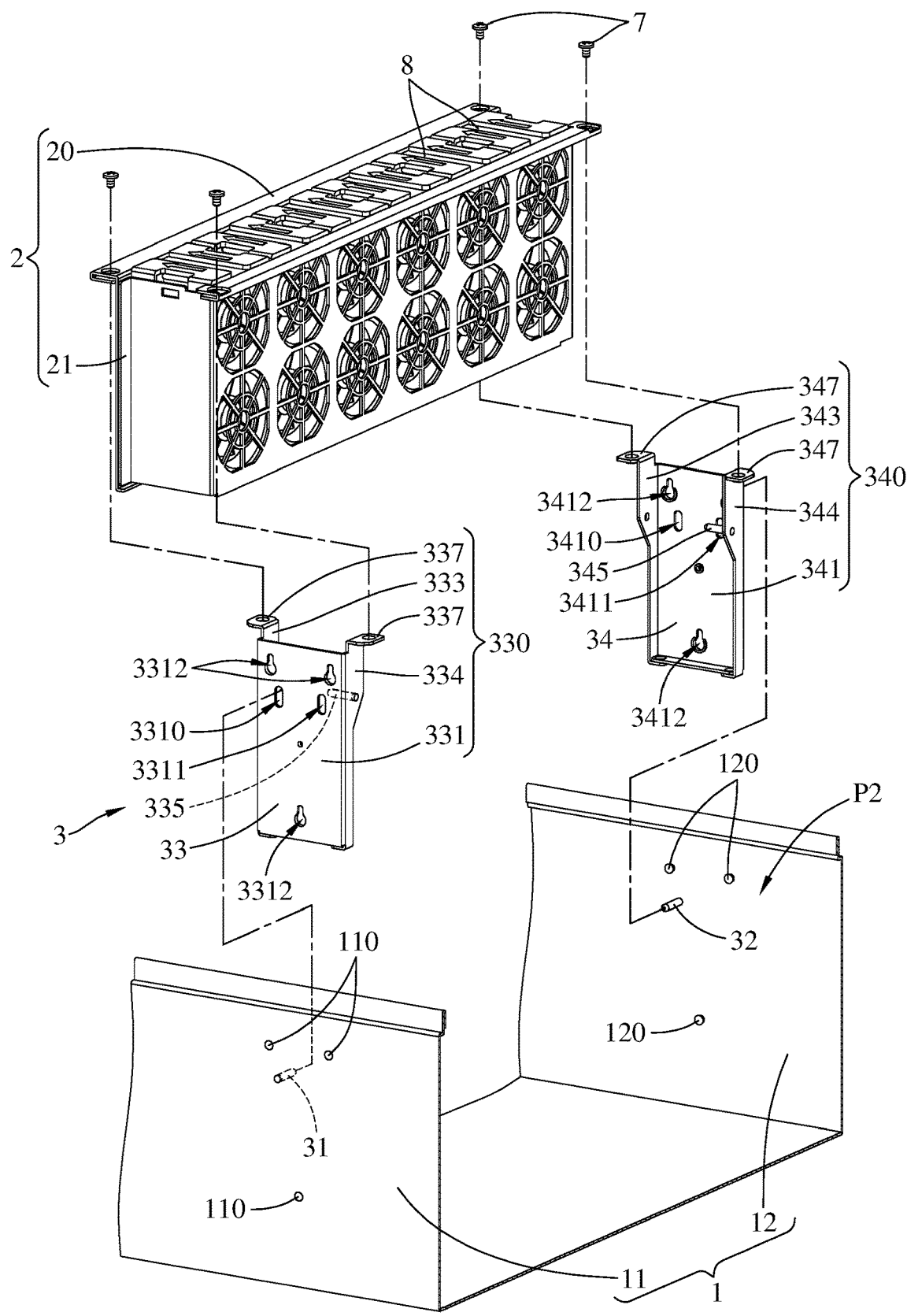
FIG. 3 is another exploded view of the server chassis and the heat dissipation fans in FIG. 2.

Please refer to FIG. 1 to FIG. 3. FIG. 1 is a perspective view of a server chassis 9 and heat dissipation fans 8 in accordance with one embodiment of the disclosure, FIG. 2 is an exploded view of the server chassis 9 and the heat dissipation fans 8 in FIG. 1, and FIG. 3 is another exploded view of the server chassis 9 and the heat dissipation fans 8 in FIG. 1.

In this embodiment, the server chassis 9 includes a case 1, a mounting frame 2, and a foolproof frame assembly 3. The mounting frame 2 can be properly disposed on the case 1 via the foolproof protection design of the foolproof frame assembly 3.

The case 1 includes a first side wall 11 and a second side wall 12 opposite to each other. The mounting frame 2 includes a main body 20 and two mounting side plates 21 and 22 respectively protruding from two opposite sides of the main body 20. In this embodiment, the mounting frame 2 is a fan mounting frame configured for accommodating the heat dissipation fans 8. Referring to FIG. 1, a predetermined airflow direction of the heat dissipation fans 8 in the server chassis 9 is indicated by arrows on the heat dissipation fans 8, and the arrows point upward. Therefore, there should be a foolproof structural design to ensure that the heat dissipation fans 8 are properly installed in the server chassis 9 in a predetermined orientation. However, the mounting frame 2 is not restricted to accommodate the heat dissipation fans 8; in some other embodiments, the mounting frame may be configured for accommodating other devices which should be installed in a predetermined orientation.

The foolproof frame assembly 3 includes a first blocking component 31, a second blocking component 32, a first frame 33, and a second frame 34. The first blocking component 31 and the second blocking component 32 are respectively fixed to the first side wall 11 and the second side wall 12 of the case 1. In this embodiment, the first blocking component 31 and the second blocking component 32 may be, for example, rivets respectively disposed on the first side wall 11 and the second side wall 12 of the case 1 via the riveting process.

The first frame 33 and the second frame 34 are respectively configured to be disposed in a first mounting position P1 and a second mounting position P2 located at two opposite sides of the case 1 to form a space for accommodating the mounting frame 2. The first frame 33 and the second frame 34 can support the mounting frame 2, and the mounting frame 2 can be fastened thereto. As shown in FIG. 2 and FIG. 3, the first mounting position P1 and the second mounting position P2 are respectively located at the first side wall 11 and the second side wall 12 of the case 1, and the first blocking component 31 and the second blocking component 32 are respectively located in the first mounting position P1 and the second mounting position P2.

The first frame 33 includes a first bottom plate 331, two first side plates 333 and 334, a first foolproof component 335 and two first support plates 337.

The first bottom plate 331 has two first through holes 3310 and 3311 and a plurality of the engagement holes 3312. The first through hole 3310 is configured for the first blocking component 31 to be disposed therethrough, and the engagement holes 3312 are configured to respectively engage with engagement pins 110 on the first side wall 11 of the case 1 when the first frame 33 is disposed in the first mounting position P1.

The first side plates 333 and 334 are respectively connected to two opposite sides of the first bottom plate 331 and both are non-parallel to the first bottom plate 331. In this embodiment, each of the first side plates 333 and 334 is substantially at an angle of 90 degrees to the first bottom plate 331, but the present disclosure is not limited thereto. In other embodiments, the first side plate can be at any angle to the first bottom plate according to actual requirements.

The first foolproof component 335 is fixed to the first side plate 334 and blocks the first through hole 3311 of the first bottom plate 331.

The two first support plates 337 are respectively connected to the two first side plates 333 and 334 and respectively extend away from each other.

The second frame 34 includes a second bottom plate 341, two second side plates 343 and 344, a second foolproof component 345, and two second support plates 347.

The second bottom plate 341 has two second through holes 3410 and 3411 and a plurality of engagement holes 3412. The second through hole 3410 is configured for the second blocking component 32 to be disposed therethrough, and the engagement holes 3412 are configured to respectively engage with engagement pins 120 on the second side wall 12 of the case 1 when the second frame 34 is disposed in the second mounting position P2.

The second side plates 343 and 344 are respectively connected to two opposite sides of the second bottom plate 341 and both non-parallel to the second bottom plate 341. In this embodiment, each of the second side plates 343 and 344 is substantially at an angle of 90 degrees to the second bottom plate 341, but the present disclosure is not limited thereto. In other embodiments, the second side plate can be at any angle to the second bottom plate according to actual requirements. Said "substantially at an angle of 90 degrees" indicates that one element is at an angle of 90 degrees or near 90 degrees to another element.

The second foolproof component 345 is fixed to the second side plate 344 and blocks the second through hole 3411 of the second bottom plate 341.

The two second support plates 347 are respectively connected to the two second side plates 343 and 344 and respectively extend away from each other. The first support plates 337 and the second support plates 347 are substantially located on a same plane and together configured to support the mounting frame 2. Furthermore, the mounting frame 2 is, for example, fastened to the first support plates 337 and the second support plates 347 via screws.

In this embodiment, the first foolproof component 335 and the second foolproof component 345 are, for example, rivets. The first foolproof component 335 is fixed to the first side plate 334 of the first frame 33 via the riveting process, and the second foolproof component 345 is fixed to the second side plate 344 of the second frame 34 via the riveting process.

In this embodiment, the first bottom plate 331, the first side plates 333 and 334, and the first support plates 337 of the first frame 33 are made of a single piece and together constitute a first sheet metal component 330, and the second bottom plate 341, the second side plates 343 and 344, and the second support plates 347 of the second frame 34 are made of a single piece and together constitute a second sheet metal component 340. In addition, the first sheet metal component 330 and the second sheet metal component 340 are the same in structure. In this embodiment, since the first sheet metal component 330 and the second sheet metal component 340 are the same in structure, they can be manufactured by the same mold. Then, the first frame 33 and the second frame 34, which are mirror-symmetrical to each other, can be formed by riveting the first foolproof component 335 to the first side plate 334 of the first sheet metal component 330 and riveting the second foolproof component 345 to the second side plate 344 of the second sheet metal component 340. Therefore, the manufacturing cost of the server chassis 9 can be reduced because there is no need to use different molds for manufacturing the first frame and the second frame.

Figure 4:
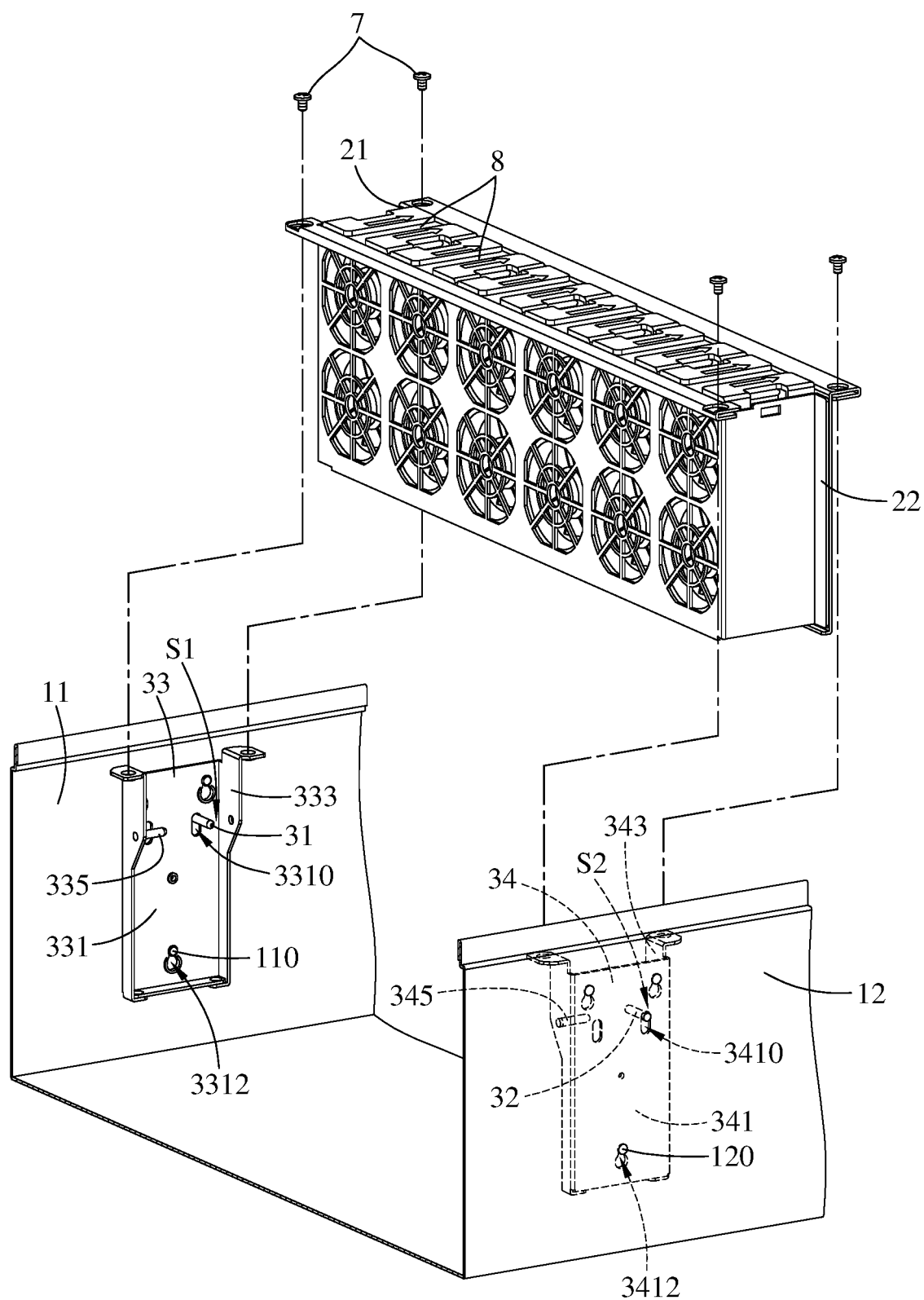
FIG. 4 is a partial exploded view of the server chassis and the heat dissipation fans in FIG. 1.
Figure 5:
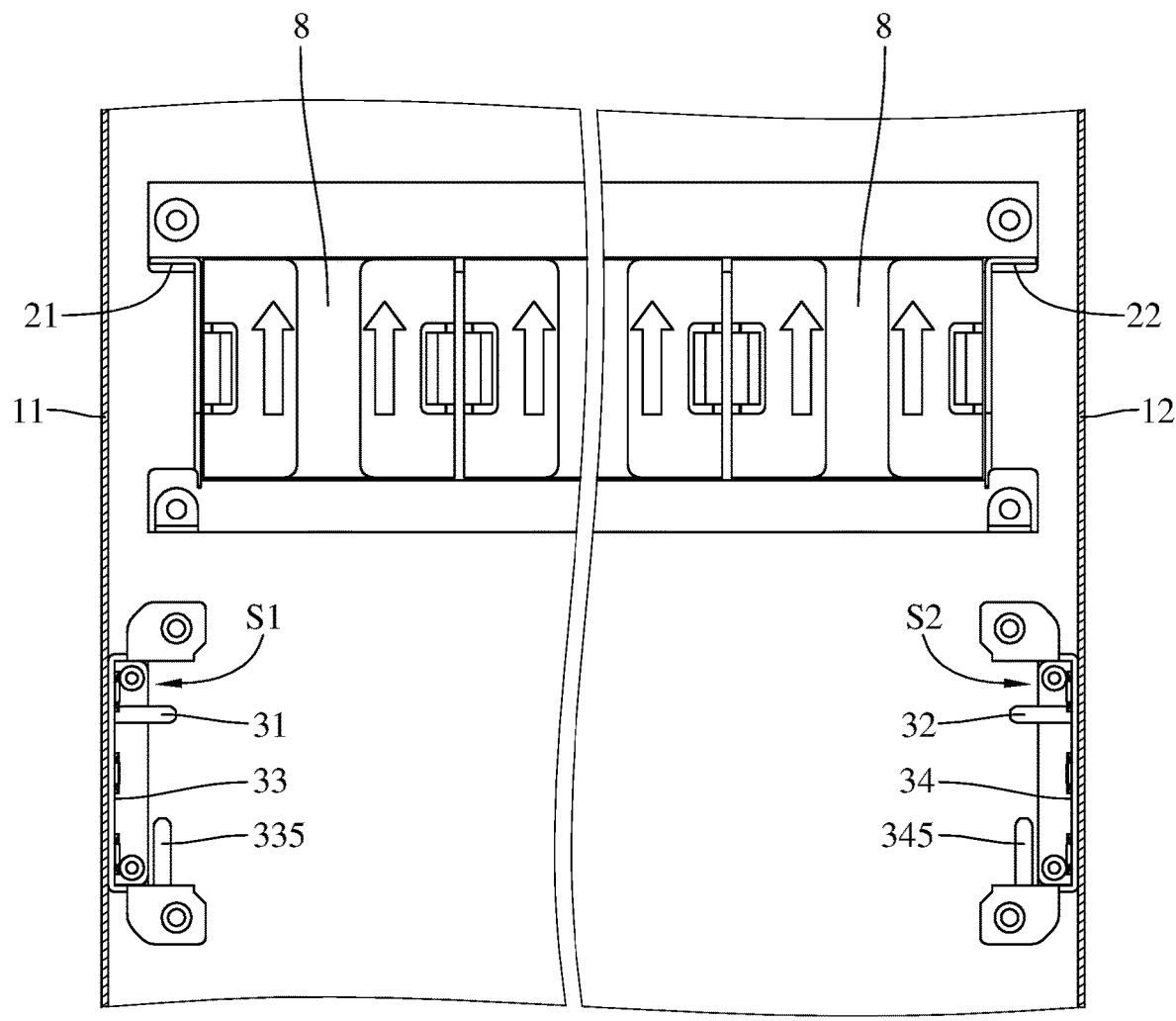
FIG. 5 is a top view of the server chassis and the heat dissipation fans in FIG. 4.

Please refer to FIG. 4 and FIG. 5. FIG. 4 is a partial exploded view of the server chassis 9 and the heat dissipation fans 8 in FIG. 1, and FIG. 5 is a top view of the server chassis 9 and the heat dissipation fans 8 in FIG. 4. FIG. 4 and FIG. 5 show that the first frame 33 and the second frame 34 are already disposed in the first mounting position P1 and the second mounting position P2, respectively, and the mounting frame 2 is not disposed on the first frame 33 and the second frame 34 yet.

When the first frame 33 is disposed in the first mounting position P1, the engagement holes 3312 respectively engage with the engagement pins 110 of the first side wall 11 of the case 1, the first blocking component 31 is disposed through the first through hole 3310 of the first bottom plate 331, and the first blocking component 31 and the first side plate 333 together form a first space S1 configured for the mounting side plate 21 of the mounting frame 2 to be disposed therethrough.

When the second frame 34 is disposed in the second mounting position P2, the engagement holes 3412 respectively engage with the engagement pins 120 of the second side wall 12 of the case 1, the second blocking component 32 is disposed through the second through hole 3410 of the second bottom plate 341, and the second blocking component 32 and the second side plate 343 together form a second space S2 configured for the mounting side plate 22 of the mounting frame 2 to be disposed therethrough.

Figure 6:
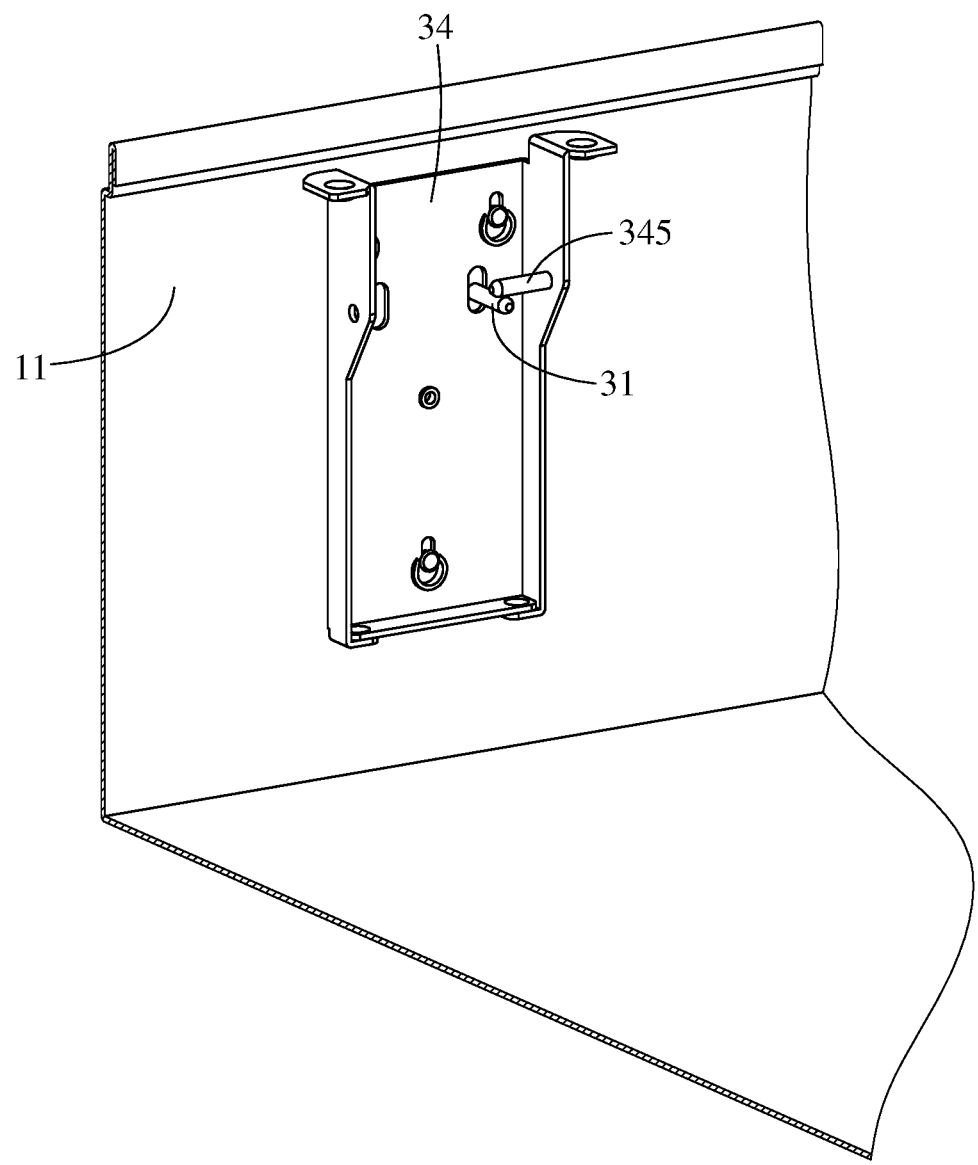
FIG. 6 is a partial perspective view of the server chassis in FIG. 1 while a second frame is being disposed in a first mounting position.

In this embodiment, the first blocking component 31 and the second blocking component 32, respectively mounted on the first side wall 11 and the second side wall 12 of the case 1, can prevent the first frame 33 from being installed in the second mounting position P2 and prevent the second frame 34 from being installed in the first mounting position P1. In specific, please refer to FIG. 6, which is a partial perspective view of the server chassis 9 in FIG. 1 while the second frame 34 is being disposed in a first mounting position. As shown in FIG. 6, during the installation of the second frame 34 in the first mounting position P1, the second foolproof component 345 on the second frame 34 interferes with the first blocking component 31, such that the second frame 34 cannot be firmly disposed in the first mounting position P1, thereby realizing foolproof protection. Similarly, when the first frame 33 is to be disposed in the second mounting position P2, the first foolproof component 335 on the first frame 33 interferes with the second blocking component 32, such that the first frame 33 cannot be firmly disposed in the second mounting position P2. As such, it ensures that the first frame 33 can only be disposed in the first mounting position P1, and the second frame 34 can only be disposed in the second mounting position P2.

Figure 7:
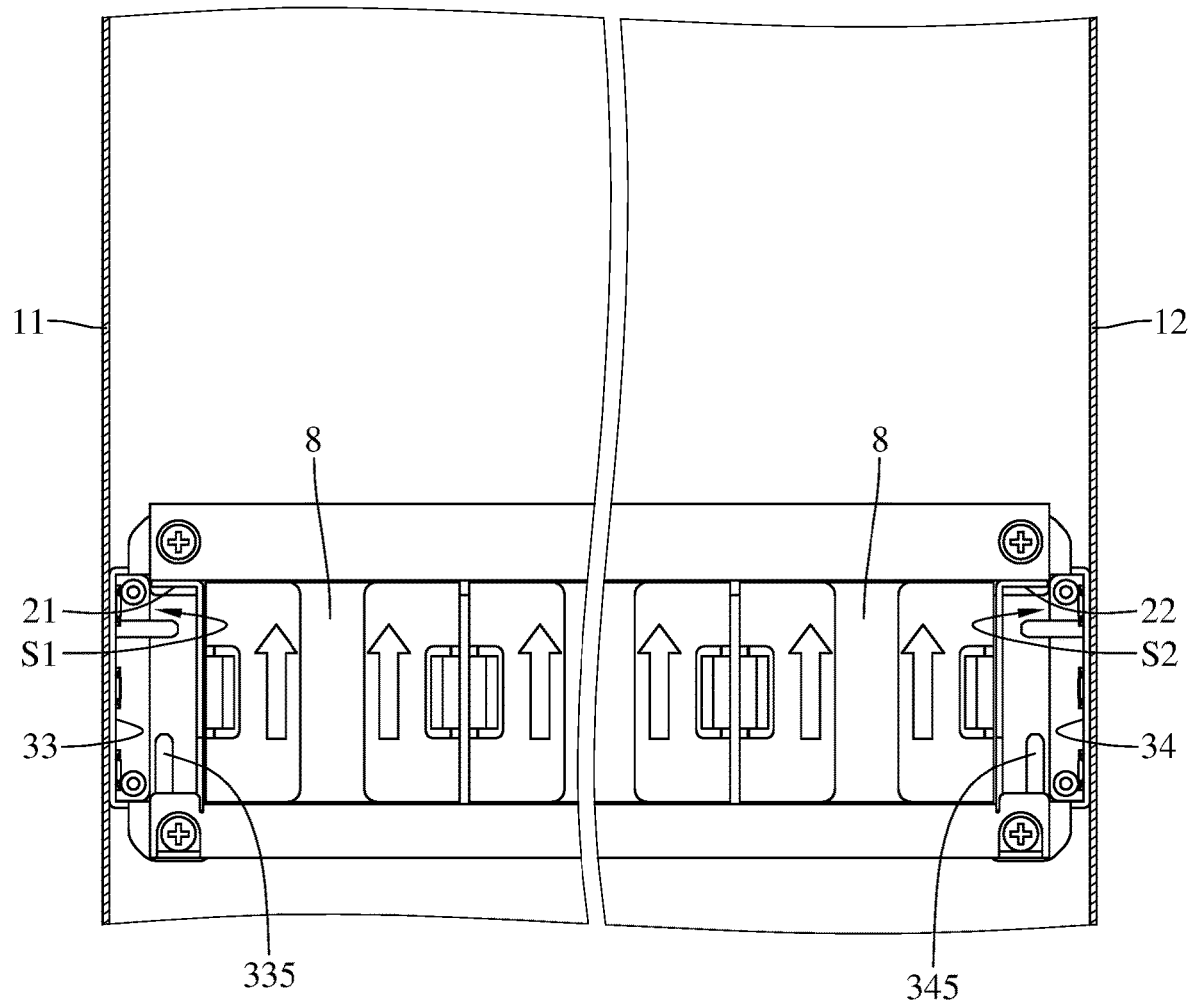
FIG. 7 is a top view of the server chassis in FIG. 1.
Figure 8:
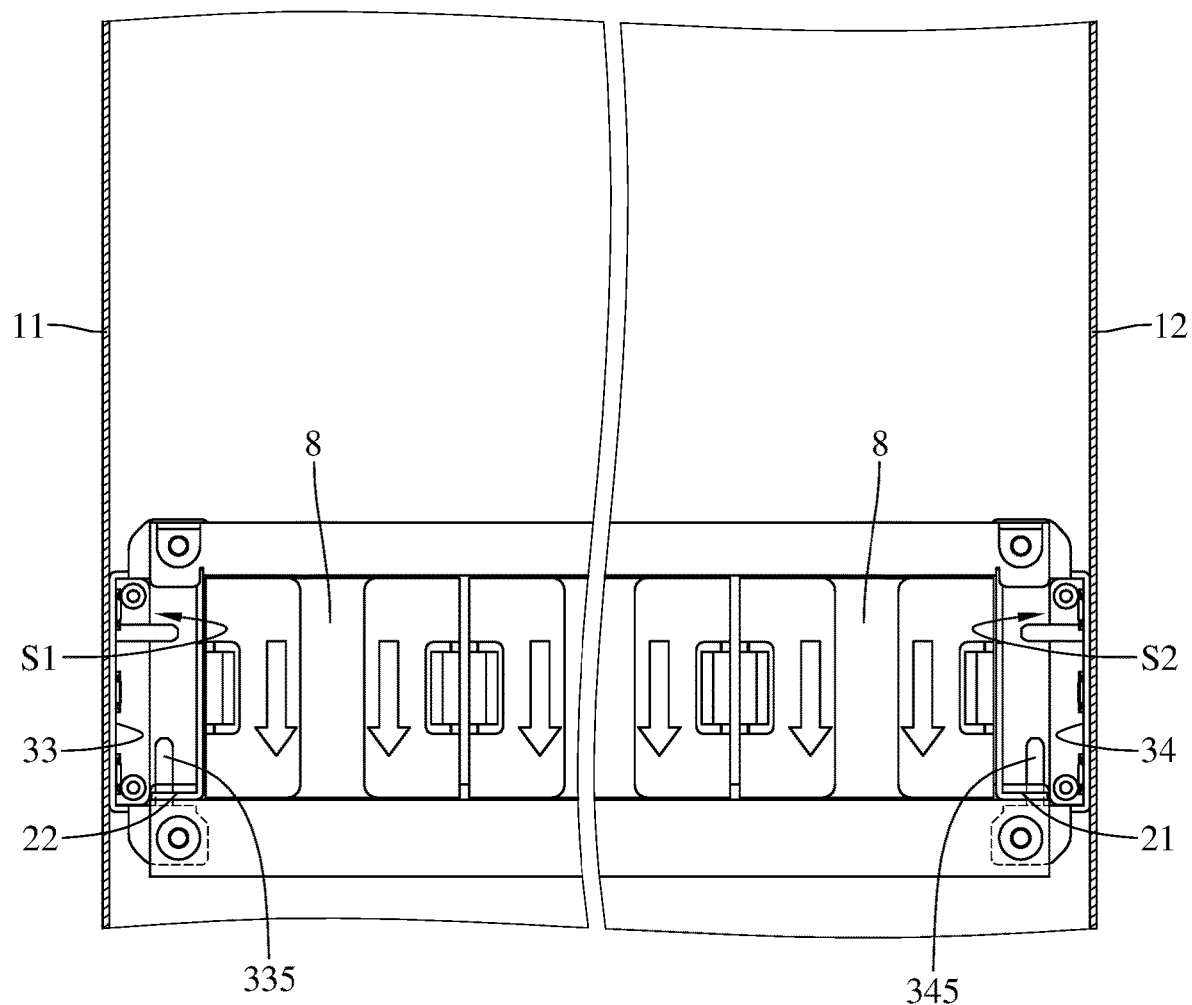
FIG. 8 is a top view of the server chassis in FIG. 1 when a mounting frame with the heat dissipation fans is improperly installed on the foolproof frame assembly.

In this embodiment, after the first frame 33 and the second frame 34 are respectively disposed in the first mounting position P1 and the second mounting position P2 as desired, the mounting frame 2 can be disposed on the first frame 33 and the second frame 34. Also, the first foolproof component 335 on the first frame 33 and the second foolproof component 345 on the second frame 34 can prevent the mounting frame 2 from being improperly installed on the first frame 33 and the second frame 34. In detail, please refer to FIG. 7 and FIG. 8. FIG. 7 is a top view of the server chassis 9 in FIG. 1, and FIG. 8 is a top view of the server chassis in FIG. 1 when the mounting frame 2 with the heat dissipation fans 8 is improperly installed on the foolproof frame assembly 3. There may be two installation orientations of the mounting frame 2, FIG. 7 shows an installation of the mounting frame 2 on the first frame 33 and the second frame 34 in one orientation, and FIG. 8 shows an installation of the mounting frame 2 on the first frame 33 and the second frame 34 in an opposite orientation. During the installation of the mounting frame 2 in the installation orientation shown in FIG. 8, the first foolproof component 335 and the second foolproof component 345 block the mounting side plates 21 and 22 of the mounting frame 2, such that the mounting frame 2 is unable to be successfully installed on the first frame 33 and the second frame 34 in this installation orientation. However, in the other installation orientation as shown in FIG. 7, the mounting side plates 21 and 22 are respectively disposed through the first space S1 and the second space S2 and do not interfere with other components, and thus the mounting frame 2 is successfully installed the first frame 33 and the second frame 34 and maintained in a predetermined mounting position (as shown in FIG. 7).

By contrast, if the first foolproof component 335 and the second foolproof component 345 are removed from the first frame 33 and the second frame 34 (i.e., in a configuration of a first frame without the first foolproof component 335 and a second frame without the second foolproof component 345), the mounting frame 2 can be installed in either the installation orientation shown in FIG. 7 or the other shown in FIG. 8, such that the arrows on the heat dissipation fans 8 may point upward or downward. However, as shown in FIG. 8, the installation orientation of the mounting frame 2 makes the arrows on the heat dissipation fans 8 point downward, which point wrong direction. Therefore, the installation orientation of the mounting frame 2 shown in FIG. 8 is incorrect, such that the heat dissipation fans 8 cannot effectively dissipate heat generated in the server.

Accordingly, the first foolproof component 335 and the second foolproof component 345 respectively disposed on the first frame 33 and the second frame 34 can block the mounting side plates 22 and 21 of the mounting frame 2 when the mounting frame 2 is disposed on the first frame 33 and the second frame 34 in a non-predetermined orientation (as shown in FIG. 8), such that an unexpected installation of the mounting frame 2 is prevented, thereby realizing foolproof protection. That is, the configuration of the first foolproof component 335 and the second foolproof component 345 ensures that the mounting frame 2 is properly disposed in the predetermined mounting position (as shown in FIG. 7).

In this embodiment, the foolproof frame assembly 3 includes the two blocking components 31 and 32 respectively fixed to the two side walls 11 and 12 of the case 1 so as to prevent the first frame 33 from being disposed in the second mounting position P2 and prevent the second frame 34 from being disposed in the first mounting position P1, but the present disclosure is not limited thereto. In other embodiments, a foolproof frame assembly may only have one blocking component, and the blocking component is fixed to one of the side walls of the case. In this case, it also ensures that the two frames are disposed in predetermined mounting positions. In specific, in one exemplary embodiment, a foolproof frame assembly has only one blocking component, and the blocking component is the aforementioned first blocking component fixed to the first side wall of the case, which can prevent the second frame from being disposed in the first mounting position. As such, even if an assembler mistakenly installs the first frame in the second mounting position first, the assembler then cannot install the second frame in the first mounting position due to the blocking component, and therefore the assembler would know that the first frame should be removed from the second mounting position and be installed in first mounting position, and then install the second frame in the second mounting position.

In this embodiment, the first frame 33 is fixed to the case 1 by having the engagement holes 3312 thereof engaging with the engagement pins 110 on the first side wall 11, and the second frame 34 is fixed to the case 1 by having the engagement holes 3412 thereof engaging with the engagement pins 120 on the second side wall 12, but the present disclosure is not limited thereto. In other embodiments, the first frame and the second frame can be fixed to the case using fasteners, such as screws, disposed through fastening holes on the bottom plates of the first and second frames and fastened to the case.

According to the server chassis and the foolproof frame assembly thereof as described above, by disposing blocking component(s) in the predetermined mounting position(s) on the case corresponding to the first frame and/or the second frame, and by the collaboration of the first foolproof component of the first frame and the second foolproof component of the second frame, an unexpected installation of the first frame being disposed in the second mounting position or the second frame being disposed in the first mounting position is prevented. Furthermore, the first foolproof component and the second foolproof component block the mounting side plates of the mounting frame so as to make the mounting side plates disposed through the first space and/or the second space formed between the blocking components and the first side plate and/or the second side plate, and thus the mounting frame is maintained in the predetermined mounting position, thereby realizing foolproof protection, preventing the heat dissipation fans in the mounting frame from being installed in a wrong direction, and ensuring that heat generated in the server device is effectively dissipated.

In one embodiment, the first bottom plate, the first side plates and the first support plates of the first frame are made of a single piece and together constitute the first sheet metal component, and the second bottom plate, the second side plates and the second support plates of the second frame are made of a single piece and together constitute the second sheet metal component. In addition, the first sheet metal component and the second sheet metal component are the same in structure. Since the first sheet metal component and the second sheet metal component are the same in structure, they can be manufactured by the same mold. Then, the first frame and the second frame, which are mirror-symmetrical to each other, can be formed by riveting the first foolproof component to the first side plate of the first sheet metal component and riveting the second foolproof component to the second side plate of the second sheet metal component. Therefore, the manufacturing cost of the server chassis can be reduced because there is no need to use different molds for manufacturing the first frame and the second frame.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A foolproof frame assembly configured to be disposed on a case of a server chassis and configured for a mounting frame to be disposed thereon, the mounting frame comprising a main body and two mounting side plates respectively protruding from two opposite sides of the main body, the foolproof frame assembly comprising:
    a first blocking component, configured to be fixed on the case;
    a first frame, configured to be disposed in a first mounting position located at one side of the case, wherein the first frame comprises a first bottom plate, two first side plates and a first foolproof component, the first bottom plate has two first through holes, the two first side plates are respectively connected to two opposite sides of the first bottom plate and both non-parallel to the first bottom plate, the first foolproof component is fixed to one of the two first side plates and blocks one of the two first through holes of the first bottom plate; when the first frame is disposed in the first mounting position, the first blocking component is disposed through the other of the two first through holes of the first bottom plate, and the first blocking component and the other of the two first side plates together form a first space configured for one of the two mounting side plates of the mounting frame to be disposed therethrough; and
    a second frame, configured to be disposed in a second mounting position located at another side of the case opposite to the first mounting position, wherein the second frame comprises a second bottom plate, two second side plates and a second foolproof component, the second bottom plate has two second through holes, the two second side plates are respectively connected to two opposite sides of the second bottom plate and both non-parallel to the second bottom plate, the second foolproof component is fixed to one of the two second side plates and blocks one of the two second through holes of the second bottom plate; when the second frame is disposed in the first mounting position, the second foolproof component overlaps the first blocking component; wherein when the first frame is disposed in the first mounting position and the second frame is disposed in the second mounting position, the first foolproof component is configured to block a second mounting plate of the two mounting side plates of the mounting frame and the second foolproof component is configured to block a first mounting plate of the two mounting side plates of the mounting frame so as to make the first mounting plate of the two mounting side plates disposed through the first space, and thus the mounting frame is maintained in a predetermined mounting position.

2. The foolproof frame assembly according to claim 1, further comprising a second blocking component configured to be fixed on the case, wherein when the second frame is disposed in the second mounting position, the second blocking component is disposed through the other of the two second through holes of the second bottom plate, and the second blocking component and the other of the two second side plates together form a second space configured for the other of the two mounting side plates of the mounting frame to be disposed therethrough; when the first frame is disposed in the second mounting position, the first foolproof component overlaps the second blocking component; when the first frame is disposed in the first mounting position and the second frame is disposed in the second mounting position, the first foolproof component is configured to block the second mounting plate of the two mounting side plates of the mounting frame and the second foolproof component is configured to block the first mounting plate of the two mounting side plates of the mounting frame so as to make the first mounting plate of the two mounting side plates disposed through the first space and the second mounting plate of the two mounting side plates disposed through the second space, and thus the mounting frame is maintained in the predetermined mounting position.

3. The foolproof frame assembly according to claim 1, wherein each of the first bottom plate and the second bottom plate has a plurality of fastening holes, and each of the fastening holes is configured for a fastener to be inserted therethrough, such that the first bottom plate and the second bottom plate are fastened to the case by the fasteners.

4. The foolproof frame assembly according to claim 1, wherein the first bottom plate and the two first side plates are made of a single piece and together constitute a first sheet metal component, the second bottom plate and the two second side plates are made of a single piece and together constitute a second sheet metal component, and the first sheet metal component and the second sheet metal component are same in structure.

5. The foolproof frame assembly according to claim 1, wherein the first frame and the second frame are mirror-symmetrical to each other.

6. The foolproof frame assembly according to claim 1, wherein the first frame further comprises two first support plates, the two first support plates are respectively connected to the two first side plates and respectively extend away from each other, the second frame further comprises two second support plates, the two second support plates are respectively connected to the two second side plates and respectively extend away from each other, and the two first support plates and the two second support plates are substantially located on a same plane and together configured to support the mounting frame.

7. The foolproof frame assembly according to claim 6, wherein the first bottom plate, the two first side plates and the two first support plates are made of a single piece and together constitute a first sheet metal component, the second bottom plate, the two second side plates and the two second support plates are made of a single piece and together constitute a second sheet metal component, and the first sheet metal component and the second sheet metal component are same in structure.

8. A server chassis, comprising:
a case;
a mounting frame, comprising a main body and two mounting side plates respectively protruding from two opposite sides of the main body; and
a foolproof frame assembly, comprising:
a first blocking component, fixed on the case;
a first frame, disposed in a first mounting position located at one side of the case, wherein the first frame comprises a first bottom plate, two first side plates and a first foolproof component, the first bottom plate has two first through holes, the two first side plates are respectively connected to two opposite sides of the first bottom plate and both non-parallel to the first bottom plate, the first foolproof component is fixed to one of the two first side plates and blocks one of the two first through holes of the first bottom plate; when the first frame is disposed in the first mounting position, the first blocking component is disposed through the other of the two first through holes of the first bottom plate, and the first blocking component and the other of the two first side plates together form a first space configured for one of the two mounting side plates of the mounting frame to be disposed therethrough; and
a second frame, disposed in a second mounting position located at another side of the case opposite to the first mounting position, wherein the second frame comprises a second bottom plate, two second side plates and a second foolproof component, the second bottom plate has two second through holes, the two second side plates are respectively connected to two opposite sides of the second bottom plate and both non-parallel to the second bottom plate, the second foolproof component is fixed to one of the two second side plates and blocks one of the two second through holes of the second bottom plate; when the second frame is disposed in the first mounting position, the second foolproof component overlaps the first blocking component; wherein when the first frame is disposed in the first mounting position and the second frame is disposed in the second mounting position, the first foolproof component is configured to block a second mounting plate of the two mounting side plates of the mounting frame and the second foolproof component is configured to block a first mounting plate of the two mounting side plates of the mounting frame so as to make the first mounting plate of the two mounting side plates disposed through the first space, and thus the mounting frame is maintained in a predetermined mounting position.

9. The server chassis according to claim 8, wherein the foolproof frame assembly further comprises a second blocking component fixed on the case; when the second frame is disposed in the second mounting position, the second blocking component is disposed through the other of the two second through holes of the second bottom plate, and the second blocking component and the other of the two second side plates together form a second space configured for the other of the two mounting side plates of the mounting frame to be disposed therethrough; when the first frame is disposed in the second mounting position, the first foolproof component overlaps the second blocking component; when the first frame is disposed in the first mounting position and the second frame is disposed in the second mounting position, the first foolproof component is configured to block the second mounting plate of the two mounting side plates of the mounting frame and the second foolproof component is configured to block the first mounting plate of the two mounting side plates of the mounting frame so as to make the first mounting plate of the two mounting side plates disposed through the first space and second mounting plate of the two mounting side plates disposed through the second space, and thus the mounting frame is maintained in the predetermined mounting position.

10. The server chassis according to claim 8, wherein the first bottom plate and the two first side plates are made of a single piece and together constitute a first sheet component, the second bottom plate and the two second side plates are made of a single piece and together constitute a second sheet metal component, and the first sheet metal component and the second sheet metal component are same in structure.

* * * * *